United States Patent [19]

Saunders

[11] 3,880,674

[45] Apr. 29, 1975

[54] THERMOELECTRIC ELEMENTS AND DEVICES AND PROCESS THEREFOR

[75] Inventor: Richard C. Saunders, Simi, Calif.

[73] Assignee: Rockwell International Corporation, El Segundo, Calif.

[22] Filed: Apr. 5, 1972

[21] Appl. No.: 241,476

Related U.S. Application Data

[62] Division of Ser. No. 4,377, Jan. 20, 1970, Pat. No. 3,707,429.

[52] U.S. Cl. .................................. 136/237; 136/238

[51] Int. Cl. .................................. H01v 1/04

[58] Field of Search .................. 136/237, 238, 240; 317/241; 252/62.3 T, 62.3 ZT; 250/200; 287/20.92 L, 20.92 T, 20.92 R

[56] References Cited

UNITED STATES PATENTS

| | | | |
|---|---|---|---|
| 3,506,498 | 4/1970 | Langrod | 136/237 |
| 3,594,237 | 7/1971 | Sonnenschein | 136/237 |
| 3,692,340 | 9/1972 | Roth | 287/20.92 T |

FOREIGN PATENTS OR APPLICATIONS

| | | | |
|---|---|---|---|
| 263,106 | 7/1968 | Austria | 136/237 |

OTHER PUBLICATIONS

Horne et al., "Forming Integral Pressed Contacts for Thermoelectric Units," RCA Technical Notes, Nov. 1959.

*Primary Examiner*—Harvey E. Behrend
*Attorney, Agent, or Firm*—L. Lee Humphries; Henry Kolin

[57] ABSTRACT

A thermoelectric element consisting of an end-grooved thermoelectric body having conductive granules firmly embedded in at least one end thereof is formed by placing conductive granules on a non-reactive grooved surface, placing either a preformed thermoelectric body or preferably a moldable thermoelectric powder on top of these granules, and applying heat and pressure thereto. Preferably the grooves are V-shaped and in a concentric circular pattern.

A unitary thermoelectric device is formed by bonding the thermoelectric element to a conductive body, a barrier layer being present between facing surfaces of the thermoelectric and conductive bodies. Upon applying pressure to the assembly, the conductive granules pierce the barrier layer and form interlocking low resistance conductive paths between the bodies.

Series-connected thermoelectric modules are formed by bonding in a single operation alternate N- and P-type thermoelectric elements grooved at both ends and containing conductive granules firmly embedded in the grooves to a conductive body at one end and to separate conductive bodies at the other end of the elements. A barrier layer which is present between the facing surfaces of the thermoelectric and conductive bodies is pierced by the conductive granules which form interlocking low resistance conductive paths between the bodies.

9 Claims, 4 Drawing Figures

THERMOELECTRIC ELEMENTS AND DEVICES AND PROCESS THEREFOR

This is a division of application Ser. No. 4,377 filed Jan 20, 1970, now U.S. Pat. No. 3,707,429.

BACKGROUND OF THE INVENTION

This invention relates to improved thermoelectric elements, devices, and modules and to methods of fabricating them. More particularly, the invention relates to improved materials and methods for obtaining mechanically strong, thermally stable, low-resistance contacts to thermoelectric bodies. Still more particularly, the invention relates to a method for bonding aluminum to lead telluride.

Thermoelectric components or circuit members are made of semiconducting bodies of thermoelectric materials such as lead telluride, bismuth telluride, antimony telluride, germanium telluride, lead tin telluride, silver indium telluride, silver gallium telluride, copper gallium telluride, silver antimony telluride, sodium manganese telluride, and the like. Small amounts of various additives or doping agents may be incorporated in the thermoelectric composition to modify the thermal conductivity, electrical conductivity, or electrical polarity of the material.

Generally two thermoelectric circuit members or components are bonded to a block of metal, which may, for example, be aluminum, copper, or iron, to form a thermoelectric junction. The two members are of thermoelectrically complementary types: one member is made of P-type thermoelectric material and the other of N-type thermoelectric material. Whether a particular thermoelectric material is designated N-type or P-type depends upon the direction of conventional current flow across the cold junction of a thermocouple formed by the thermoelectric material in question and a metal, such as copper or lead, when the thermocouple is operating as a thermoelectric generator according to the Seebeck effect. The present invention relates to both P-type and N-type thermoelectric materials. These materials consist of the binary and ternary semiconducting alloys of tellurium. Preferably the binary telluride alloys such as lead telluride, bismuth telluride, antimony telluride, and germanium telluride are employed as the thermoelectric materials. Particularly preferred because of their desirable thermoelectric and physical properties are lead telluride, bismuth telluride and lead tin telluride.

Heretofore, there has been considerable difficulty in the joining of thermoelectric semiconductor elements into arrays of suitable voltage and power output. This difficulty has been particularly pronounced in forming a satisfactory bond between the thermoelectric element and the conductive material at the hot junction. The conductive material to be bonded to the semiconductor material must satisfy a varied set of stringent requirements, namely, low electrical resistivity, high thermal conductivity, thermal expansivity closely matching that of the semiconductor, low vapor pressure, melting point well above the maximum operating temperature of the device, and, particularly, chemical and atomic or electronic compatibility with the semiconductor. By chemical compatibility or stability, I refer to the fact that the conductive material and the thermoelement being joined do not form an intermetallic compound of higher resistivity than either material, thereby resulting in a high-resistance contact. Chemical instability may also occur in other forms. For example, the electrode material may alloy with the thermoelement in a eutectic reaction which lowers the melting point of the alloyed layer; of the conductive electrode material may diffuse into the thermoelement forming second phase highly conductive material which causes local short circuiting of the thermoelectric element; or the electrode material may react directly with the thermoelectric alloy to destroy its molecular form; or the electrode material may dissolve a doping agent to effectively leach it out of the thermoelement.

By atomic or electronic compatibility, I refer to the fact that the conductive material does not "poison" the semiconductor thermoelement; that is, no deterioration occurs in the thermoelectric power of the thermoelement by the transfer of charge carriers between the thermoelement and the conductive material. Thus, the electrode material may diffuse into the thermoelement where it may form donor or acceptor sites to alter the local carrier concentration. For example, a conductive material containing arsenic would ordinarily be unsatisfactory for use with a semiconductor such as germanium telluride because pentavalent arsenic would act as a donor of charge carriers to the germanium, which could deleteriously affect the thermoelectric properties of the germanium telluride.

Because of the multiplicity of varying and often conflicting requirements, it is frequently necessary to match the conductive material and the semiconductor in accordance with the more stringent of the requirements, and compromise with regard to those of secondary importance, such as thermal and electrical conductivities. Aside from the melting-point consideration, the fundamental requirements to be met by a satisfactory ohmic bond relate to the chemical and atomic compatibilities, as well as a matching of the coefficient of thermal expansion. These conditions severely restrict the choice of conductive materials for forming a junction with a given semiconductor.

Other difficulties arise in that intermediate layers of high resistivity are encountered in many junctions where oxidized surfaces are brought together without adequate removal of the oxide layer. Most of the thermoelements of practical use today form thin surface oxide layers immediately upon exposure to air and must be properly treated to remove such oxides before a good contact can be formed.

In U.S. Pat. Nos. 3,372,469 and 3,392,439 are shown methods for bonding thermoelectric and conductive bodies to form a thermoelectric device whereby conductive granules, preferably tungsten granules, are embedded into pre-existing thermoelectric bodies by use of hot-pressing or cold-pressing techniques; a barrier layer is provided between facing surfaces of the thermoelectric and conductive bodies; and the two bodies are then pressed together so that the conductive granules penetrate the barrier layer to form low resistance conductive paths between the thermoelectric and conductive bodies. The present invention is an improvement over the processes shown in these two patents.

SUMMARY OF THE INVENTION

It is an object of the present invention to provide an improved method for forming thermoelectric elements, devices and modules whereby a much stronger bond than heretofore available is obtained between the conductive particles and the thermoelectric body prior to bonding to the conductive body. This enhanced mechanical bond subsequently provides firm interlocking of the points of contact between the thermoelectric element and the conductive body as well as greatly increased electrically conductive contact area.

In accordance with the invention, grooved thermoelectric elements are provided which contain conductive granules firmly embedded in the grooves. Such elements are preferably formed by molding a moldable thermoelectric powder on a grooved inert surface, conductive granules being disposed in the grooves, by the application of suitable heat and/or pressure, i.e., hot-pressing or cold-pressing. It is particularly preferred that the grooves present in the inert surface be V-shaped, generally at a 90° angle, and disposed in an essentially concentric circular pattern, rather than in a cross-hatched array. Thereby minimal dispersal of the conductive particles occurs during the molding operation, and the resulting thermoelectric element has maximum interlocking of the conductive particles in the face of the thermoelectric body and also with the conductive body on subsequent formation of the thermoelectric device.

Alternatively, the grooved thermoelectric element containing conductive granules firmly embedded in the grooves may be formed by a hot pressing or cold pressing operation in which an already formed thermoelectric body is pressed against a grooved punch containing conductive granules disposed in the grooves. Thereby, by the application of suitable heat and/or pressure, the contacted face of the thermoelectric body will have its surface correspondingly grooved by the grooved punch, and at the same time the conductive granules will be firmly embedded in the grooved surface. While this alternative method represents an improvement over the process set forth in U.S. Pat. Nos. 3,372,469 and 3,392,439, optimum results are obtained by the preferred comolding technique. Accordingly, this preferred process will be exemplified herein.

Suitably, the appropriately grooved face of a punch in a punch and die assembly is first loaded with conductive granules, preferably granules of tungsten or an alloy thereof, and then the die cavity is filled with an appropriate weight of thermoelectric powder. Heat and pressure are applied so that the deposit of conductive granules is reproduced in reverse in the thermoelectric element, leaving these firmly embedded conductive granules protruding at the exposed tips and edges of the grooves. Then during the subsequent bonding step to form the thermoelectric device in which the formed thermoelectric element is pressed against a barrier layer disposed between the thermoelectric element and the conductive body, preferably by hot-pressing, the conductive particles or granules penetrate the barrier layer, forming low resistance conductive paths for the conduction of an electric current between the thermoelectric and conductive bodies through the barrier layer. The presence of V-shaped grooves in the thermoelectric element enhances the mechanical bond and current flow between the thermoelectric and conductive bodies due to the greatly increased conductive contact area and the resulting interlocking. The grooves also tend to retard oxidation at the interface between the bodies due to the increased diffusion path provided.

In a preferred feature of the invention, multiple cavity dies are used to form thermoelectric elements having grooved surfaces on opposite faces, with conductive granules firmly embedded in these grooved surfaces. Half the number of total punches, each having a grooved surface at one end in which conductive granules are held, are loaded into the bottom of the multicavity dies. The die cavities are then filled with the appropriate weight of thermoelectric powder on top of the conductive granules. The remaining punches are loaded into the top of the die. The conductive granule-filled faces of the upper punches are also placed facing the thermoelectric powder. The smooth ends of the punches protrude from each face of the dies allowing for motion at both ends of the cavity as pressure is applied. The protruding punches of each die and punch assembly are staggered with the adjacent set as they are stacked in a furnace retort. This allows for the punches of one die set to bear on the die of the adjacent set, thus eliminating cumulative frictional forces from one die set to another and allowing for maximum packing density in the retort. Each of the so-formed thermoelectric elements contains grooved surfaces at opposite ends, with the conductive granules firmly embedded therein.

It is another feature of this invention that thermoelectric modules may be constructed using a "free-standing" technique eliminating the need for complex dies or end-capping. Heretofore, a thermoelectric body or element had to be capped, at least on one end, by being bonded to a conductive body prior to the capped body being then joined to conductive straps for assembly in a module. With the present process, thermoelectric elements having both ends grooved are positioned on cold straps in alternate sequence of N-doped and P-doped elements. Hot straps are then separately positioned on top of the thermoelectric elements so as to connect them in electrical series. Then with a single application of pressure and heat, the entire module is formed in one operation. The conductive granules embedded in the grooves pierce a barrier layer which is present between the facing surfaces of the thermoelectric and conductive bodies forming interlocking low-resistance conductive paths between the bodies.

The barrier layer is essentially a chemically and electrically inert high-resistance layer which prevents the movement of charge carriers therethrough or chemical interaction between the thermoelectric and conductive bodies. It is an artificial layer, or is genetically derived from either or both of the thermoelectric and conductive bodies. Its presence allows for forming stable bonds between conductive bodies and thermoelectric bodies which may be chemically or atomically incompatible, without the occurrence of electronic deterioration of the thermoelectric bodies or the formation of high-resistance contacts between the thermoelectric and conductive bodies. While the thickness of the barrier layer is not critical per se, the layer must, of course, be penetrable by the conductive granules. Films varying in thickness between a few tenths of a mil and several hundred mils are contemplated.

by the term "genetically derived" I refer to layers, coatings, or films formed on a surface of either or both of the conductive body and the thermoelectric body by chemical reaction with the material comprising this body. For example, where conductive bodies are plates of aluminum or an aluminum alloy, a genetically derived, thin aluminum oxide coating will be rapidly formed on the surfaces of the aluminum, particularly at elevated temperatures under oxidizing conditions. The granules will penetrate this layer to form low-resistance ohmic paths between the aluminum plate and the thermoelectric body. Similarly, a passivated iron oxide film may be genetically formed where the metal plates are of iron. Alternatively, a vitreous, adhering material such as titanium silicide may be deposited on the conductive bodies to form barrier layers.

DESCRIPTION OF THE PREFERRED EMBODIMENTS

In its broadest aspects, the present invention is an improvement over the processes shown and the products obtained thereby set forth in U.S. Pat. Nos. 3,372,469 and 3,392,439. Essential and non-essential subject matter contained in these patents is incorporated herein by reference. Thus the considerations set forth in these patents with respect to the selection and utilization of various thermoelectric and conductive bodies, conductive granules, and appropriate barrier layers to provide desired thermomechanical and electrical properties of the formed thermoelectric elements and devices will be equally applicable to the present invention. However, for purposes of illustration, the invention will be particularly described in its preferred embodiments with reference to specific materials, elements, and devices, although clearly not limited thereto.

Figure 1:
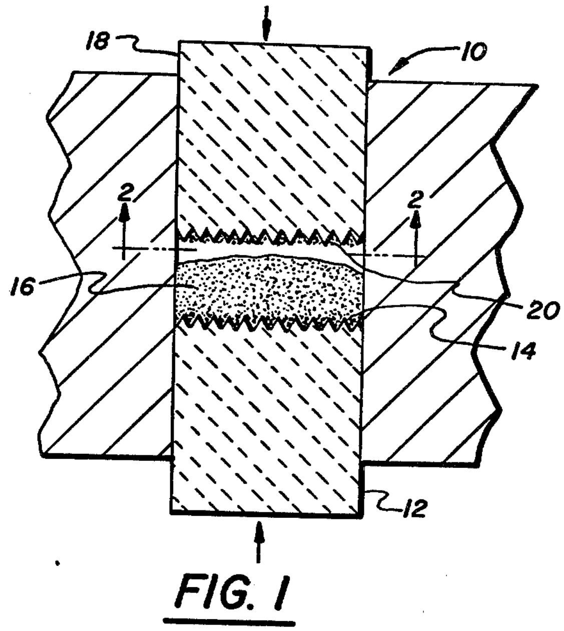
FIG. 1 is a cross-sectional view in elevation of a portion of a punch and die assembly used for forming the thermoelectric elements of this invention.

In FIG. 1 is shown a schematic sectional view of a portion of a punch and die assembly 10 utilized in forming the thermoelectric elements. Under preferred conditions of actual operation, multiple cavity dies containing a plurality of punches are used. A lower punch 12, made of an inert non-reactive material such as graphite, has an upper grooved surface 14 in which the grooves are preferably V-shaped and arranged in a concentric circular pattern. Conductive particles, preferably tungsten, are loaded onto the grooved face 14. Conveniently, the ends of the punches are wet with a liquid adhesive-like material, e.g., diphenyl ether, so that the tungsten particles are adhered to the grooves by surface tension. Excess conductive particles are shaken off. A telluride thermoelectric powder 16 is then loaded on top of the tungsten particles. Where two opposite faces of the resulting thermoelectric element are to be grooved, then an inverted punch 18, with a similarly grooved face 20 retaining tungsten granules thereon, is placed in opposing relationship to the thermoelectric powder. Where the punch is inverted, then the wetting of the punch with an adhesive-like material prior to depositing the conductive particles thereon is important in order to retain the conductive particles within the grooves prior to the pressing operation. Pressure is then applied to the ends of punches 12 and 18, generally at elevated temperatures, to form a thermoelectric element consisting of a thermoelectric body having grooved faces on opposite ends thereof, conforming to the grooves of the punch faces, with the conductive particles firmly embedded therein.

Figure 2:
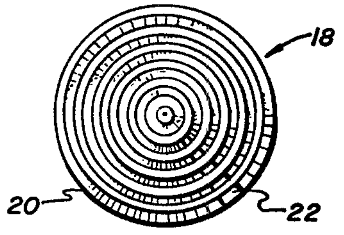
FIG. 2 is a plan view taken along the lines 2—2 of FIG. 1 of the face of a grooved punch.

In FIG. 2 is shown a plan view of the surface 20 of grooved punch 18 taken along the lines 2—2 of FIG. 1. As may be noted, the grooves 22 are arranged in concentric circles. Typically, for a preferred construction, V-shaped grooves 5 mils deep of 90° angles are machined at the end of the punch in a pattern of concentric circles having a 10-mil spacing. Such a concentric arrangement of the V-shaped grooves is particularly preferred to reduce to a minimum the dispersal of conductive particles from the grooved face during the pressing operation. While other grooved configurations are of course utilizable, maximum adherence of the conductive particles in the formed thermoelectric element with minimal loss of these particles during the molding operation is obtained by such an arrangement of V-shaped grooves in substantially concentric circular configuration.

Figure 3:
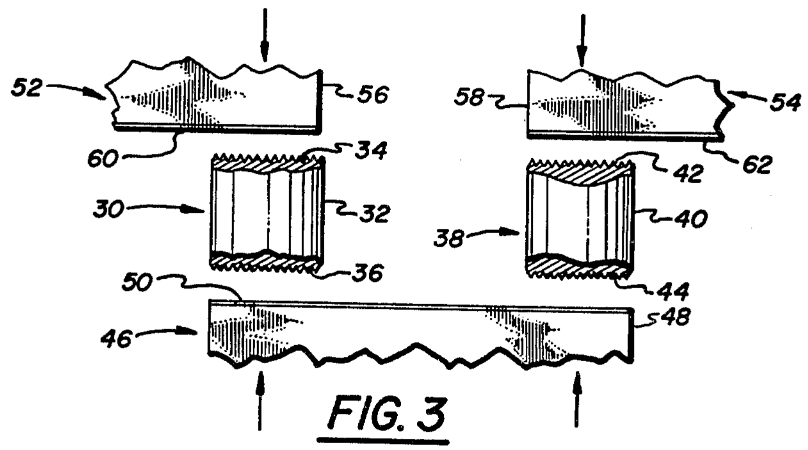
FIG. 3 is an elevational view, shown partly in section, of a component assembly prior to being bonded together to form a thermoelectric module by a single operation.

In FIG. 3 is shown a segment of a thermoelectric module in disassembled form prior to fabrication by use of the so-designated free-standing process. Heretofore thermoelectric modules have been fabricated from bodies having metallic end caps affixed to them by various methods, such as those shown in U.S. Pat. Nos. 3,372,469 and 3,392,439. Then in a separate process the capped N- and P-doped elements are alternately connected by being metallurgically bonded, e.g., by diffusion bonding or soldering techniques, to additional metallic straps connected in electrical series. The present free-standing technique eliminates the need for end-capping procedures in that the conductive strap linking the two thermoelectric elements also contacts the thermoelectric bodies directly. The need for using complex dies to support the thermoelectric elements while they are being contacted with the aluminum straps at relatively moderate temperatures and pressures is thereby eliminated.

As shown in FIG. 3, the thermoelectric element 30 consists of a lead telluride body 32 suitably doped to be N-type, having grooved faces 34 and 36 at opposite ends thereof. This thermoelectric element is prepared by the present process, such as illustrated in FIG. 1, and has tungsten particles firmly embedded in the grooved faces. Thermoelectric element 38 consists of a lead tin telluride body 40 suitably doped to be P-type and having grooved faces 42 and 44 at opposite ends thereof containing firmly embedded tungsten granules. In fabricating the module, a cold junction strap 46 consisting of a conductive aluminum body 48 of 99.99% purity is held in place on the lower platen of a graphite die (not shown). The electrically insulated surface 50 of strap 46 which faces thermoelements 30 and 38 consists essentially of a thin layer of aluminum oxide, which may be formed by plasma spraying of aluminum oxide, anodizing the aluminum body surface, or exposing the aluminum to a suitable oxidizing atmosphere, such as oxygen or air. The thermoelectric elements 30 and 38 are positioned on cold strap 46 in alternating sequence of N- and P-doped elements. Hot junction straps 52 and 54, which respectively consist of similar conductive aluminum bodies 56 and 58 with aluminum oxide layers 60 and 62 thereon, are positioned on top of the thermoelectric elements so as to connect them in electrical series, the aluminum oxide surfaces 60 and 62 being in corresponding contact with grooved surfaces 34 and 42. A top platen of the die is then placed on the module lay-up, and the entire assembly placed in a retort. Depending on the strap thickness and thermoelectric materials used, pressures varying from 500 psi to 2000 psi at temperatures between 800° and 1080°F are applied for about 5 minutes.

Figure 4:
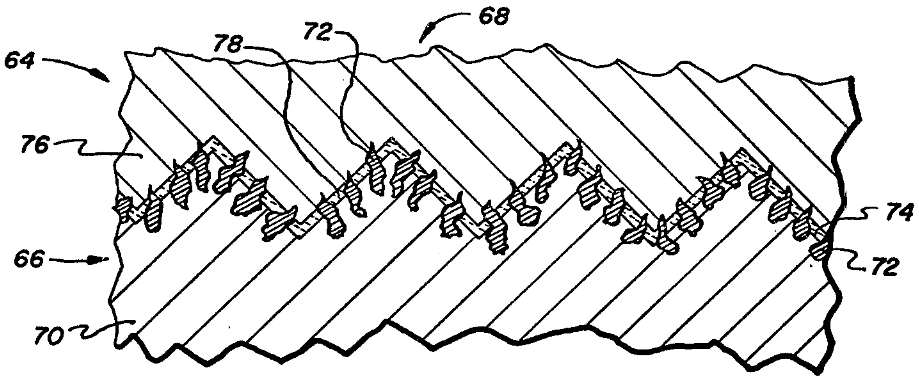
FIG. 4 is a cross-sectional view of a portion of a telluride thermoelectric device wherein a thermoelectric element is bonded to a conductive body in accordance with a preferred embodiment of the invention.

In FIG. 4 is shown an enlarged sectional view, idealized and exaggerated for purposes of illustration, of a portion of an assembled thermoelectric device 64 prepared in accordance with this invention. Such a device consisting of a telluride thermoelectric element 66 intimately bonded to a conductive strap or shoe 68 may be prepared by the process illustrated in FIG. 3. The thermoelectric element 66 consists of a telluride thermoelectric body 70 in which tungsten granules 72 are firmly embedded in the grooved surface 74 in contact with the conductive strap. This unitary thermoelement is preferably prepared by the comolding process described in connection with FIG. 1. The conductive strap 68 illustratively comprises an aluminum body 76 having an aluminum oxide barrier layer 78 on at least its facing surface in contact with the thermoelement 66. This barrier layer may constitute an artificial barrier layer interposed between the conductive and thermoelectric bodies or may be genetically derived therefrom.

A cold-pressing or preferably a hot-pressing technique is utilized to form the finally assembled thermoelectric device 64. Upon the application of pressure and heat, the aluminum oxide layer 78 and aluminum body 76 are distorted to conform to the shape of the grooved surface 74. At the same time the tungsten granules 72 penetrate the aluminum oxide layer 78 so that direct electrical contact is made between the thermoelectric body 70 and the aluminum body 76, resulting in a broad contact area, low-resistance bond between these bodies. The V-shaped grooved surface also results in an enhanced mechanical bond between these bodies because of the greatly increased surface contact area as well as the interlocking. The presence of the grooves also tends to retard oxidation at the interface between the thermoelectric and aluminum bodies because of the greatly increased diffusion path in the radial direction.

The following examples illustrate the process of the invention and are directed to its preferred aspects in providing thermoelectric elements, devices, and modules having present a particularly desirable mechanically strong, low-resistance bond between lead telluride and aluminum. However, these examples are not intended to unduly limit the generally broad scope of the present invention.

EXAMPLE 1

Element Fabrication

Two matching sets of graphite dies and punches having 16 ¼ inch diameter cavities were used to fabricate telluride thermoelectric elements. One set is used to form the 2P type sodium-doped lead telluride bodies and the other set to form the 2N type iodine-doped lead telluride bodies. The use of separate graphite dies and punches eliminates the possibility of contamination of the thermoelectric powders used. Graphite is preferred for use because of its high strength at elevated temperatures, its compatability with PbTe and PbSnTe, and its low thermal expansion coefficient allowing ready removal of the formed thermoelectric elements from the dies. The dies and punches were fabricated with the graphite grain-oriented to give maximum strength in the required direction, and were further designed with double-acting punches and positive stops to produce elements of high density and uniform length.

Each punch was grooved at one end by machining V-grooves of 90° angles in a pattern of about 15 concentric circles 5 mils deep and having a 10 mil spacing. The grooved ends of the punches were wet with diphenyl ether which was dried to a semigloss and then sprinkled with 250 to 320 mesh pure tungsten particles. Excess tungsten was removed, leaving a thin uniform layer of tungsten deposited in the grooves of the punches. Half the punches for each die set were placed in the bottom of the cavities with the grooved ends up. The N-type PbTe powder weighing 1.4 grams was placed into each of the N die cavities on top of the tungsten-filled grooves. The remaining N punches were placed into the sixteen cavities with the tungsten-filled grooves down, facing the PbTe powder. The P dies were loaded in a similar manner using 1.39 grams of P-type PbTe powder in each of the sixteen cavities.

The protruding punches of each die and punch assembly are staggered with the adjacent set as they are stacked in a retort. This allows for the punches of one die set to bear on the die of the adjacent set, thus eliminating the accumulative frictional forces from one die set to another and allowing for maximum packing density in the retort.

The retort was sealed and placed into a furnace. The retort atmosphere was cycled between vacuum and ultrapure hydrogen every 100°F up to 800°F and then left in static hydrogen for the remainder of the cycle. The retort was heated to 1350°F at which time a pressure of 3000 psi was applied for 5 minutes. The retort was cooled and the elements removed from the dies. These elements measured 0.2 inches in length and 0.237 inches in diameter. This procedure allows for the forming of dense N- and P-type lead telluride bodies having grooved ends which are impregnated with sharp, protruding firmly embedded tungsten particles ready to be bonded to aluminum contacts.

EXAMPLE 2

Module Fabrication

A ten-couple series-connected module was fabricated from thermoelectric elements prepared as in Example 1. Graphite fixtures were used to align the connecting straps in two parallel rows of ten elements each. The oval-shaped straps were punched from 0.020-in. thick, 99.99% pure aluminum sheet stock. The natural aluminum oxide layer on one face of each strap was wire brushed to remove as much of the oxide as possible. The thin oxide coating that immediately formed after this brushing is ample to act as a diffusion barrier but thin enough to be readily penetrated by tungsten particles forced against it. Eleven aluminum straps, with the cleaned aluminum oxide-coated faces up, were placed in the fixture which spaced and aligned them properly. The 20 elements were then placed on the straps at the proper location and orientation, N and P elements being alternated. The ten upper straps were then properly placed with the cleaned oxide-coated surfaces toward the grooved ends of the elements, and the top cover of the graphite fixture was placed on this array. The loaded fixture was placed into a retort and purged with ultra-pure hydrogen as in the element fabrication procedure described under Example 1. The temperature was raised to 1050°F at which time a pressure of 1000 psi was applied for 1 minute. The retort was cooled to room temperature, and the completed ten-couple module was removed. The average resistance of the N elements measured 650 milliohms each, and the P elements 535 milliohms.

This 10 couple module was placed on test at a hot junction temperature of 700°F and a cold junction temperature of 180°F in a vacuum atmosphere. Only a small degradation in power output was detectable after more than 2 years of operation.

Other similar thermoelectric modules prepared in accordance with the principles of this invention have operated at 750°F for more than 3 years with but 17% degradation of power compared to the typical 1% degradation per 1000 hours of operation characterizing known telluride thermoelectric devices.

EXAMPLE 3

Grooving of Preformed Thermoelectric Bodies

Lead telluride bodies were formed by hot pressing from powders at a temperature betweet 1350°F and 1450°F for 5 minutes. The formed bodies were placed in multiple-die cavities, and grooved graphite punches impregnated with tungsten powder were pressed in the die cavities in contact with one face of the lead telluride bodies. The assembled die was placed in a retort, and the temperature was raised to 1000°F at which time a pressure of 3000 psi was applied. The temperature was further elevated to 1350°F and held for 5 minutes, completing the hot-pressing operation.

The formed thermoelectric elements were then placed into a fixture containing aluminum plates having a surface coating of aluminum oxide. The tungsten-impregnated grooved faces of the thermoelectric elements were placed in contact with the aluminum plates. The die assembly was loaded in a retort, the temperature raised to 1050°F and the die pressed for 1 minute at 1000 psi. The formed aluminum-capped thermoelectric devices were then successfully used for module fabrication.

It will be understood that the embodiments described above are by way of example only and are not intended as limitations on the invention. Thus the invention has been particularly described utilizing conductive tungsten granules for bonding thermoelectric bodies to conductive bodies, particularly telluride thermoelectric bodies to aluminum bodies. In forming thermoelectric elements from such moldable telluride thermoelectric powders, as lead telluride or lead tin telluride, utilizing conductive tungsten granules, pressures between 1000 and 5000 psi at temperatures between 1000° and 1600°F for 1 to 30 minutes are considered suitable. However, where other thermoelectric materials are utilized, then other pressures and temperatures will be employed as are known to the art or may be readily determined for the specific materials employed; or cold pressing techniques alone may be sufficient for forming the thermoelectric elements and for bonding them to the particular conductive bodies used. Also, for certain applications where the tungsten may result in the formation of high resistivity intermetallic compounds with the conductive body, its use would be avoided. Thus other conductive metals considered suitable for use as bonding granules in practicing the invention include iron, molybdenum, titanium, vanadium, niobium, tantalum, manganese and cerium.

It will further be understood that thermoelectric modules may be provided in accordance with this invention by providing modules consisting of thermoelectric elements all of one conductivity-type, e.g., N-doped, bonded at opposite ends to conductive bodies in parallel arrangement. Similar modules having all elements of opposite type, e.g., P-type, are also provided. These modules may then be electrically interconnected in series arrangement, parallel arrangement, or combinations of series and parallel depending upon the voltage and current requirements.

Various other modifications and variations will equally well suggest themselves to those skilled in this art which may be made without departing from the spirit and scope of the instant invention.

I claim:

1. A thermoelectric device comprising a thermoelectric body bonded to a conductive body with a barrier layer therebetween, the material bonding said bodies consisting essentially of conductive granules penetrating said barrier layer thereby forming low resistance conductive paths between said bodies through said barrier layer, said granules being firmly embedded at one end thereof in substantially V-shaped grooves present in the facing surface of said thermoelectric body, said V-shaped grooves being disposed in a substantially concentric circular configuration, the barrier layer and conductive body conforming to the grooved configuration in the face surface of said thermoelectric body.

2. A device according to claim 1 wherein the spacing between concentric circles is approximately twice that of the depth of the grooves.

3. A device according to claim 1 wherein the thermoelectric body consists essentially of a telluride semiconductor, said conductive body is of aluminum, and said barrier layer is of aluminum oxide genetically derived from the aluminum body.

4. A device according to claim 3 wherein said conductive granules are of a metal selected from the group consisting of tungsten metal and tungsten alloys. surfaces

5. A thermoelectric module consisting of thermoelectric bodies bonded at opposite ends to conductive bodies with barrier layers disposed therebetween characterized in that the material bonding the thermoelectric and conductive bodies consists essentially of conductive granules penetrating said barrier layer thereby forming low resistance conductive paths between said thermoelectric and conductive bodies through said barrier layer, said granules being firmly embedded at each end thereof in substantially V-shaped grooves present in the facing surface of the thermoelectric bodies with the conductive bodies, said V-shaped grooves being disposed in a substantially concentric circular configuration, the barrier layers and conductive bodies conforming to the grooved configurations present in the facing surface of said thermoelectric bodies.

6. A thermoelectric module according to claim 5 wherein said thermoelectric bodies are of alternating N-type and P-type, a pair of said bodies being bonded at one end to a conductive body and at opposite ends to separate conductive bodies to form a series-connected current path.

7. A module according to claim 5 wherein the spacing between concentric circles is approximately twice that of the depth of the grooves.

8. A module according to claim 5 wherein the thermoelectric body consists essentially of a telluride semiconductor, said conductive body is of aluminum, and said barrier layer is of aluminum oxide genetically derived from the aluminum body.

9. A module according to claim 8 wherein said conductive grandule are of a metal selected from the group consisting of tungsten metal and tungsten alloys.

* * * * *